United States Patent [19]

Guthrie

[11] Patent Number: 5,451,910
[45] Date of Patent: Sep. 19, 1995

[54] FREQUENCY SYNTHESIZER WITH COMB SPECTRUM MIXER AND FRACTIONAL COMB FREQUENCY OFFSET

[75] Inventor: Warren E. Guthrie, Glen Ellyn, Ill.

[73] Assignee: Northrop Grumman Corporation, Los Angeles, Calif.

[21] Appl. No.: 106,154

[22] Filed: Aug. 12, 1993

[51] Int. Cl.⁶ .................................. H03L 7/081
[52] U.S. Cl. .................... 331/16; 331/12; 331/25; 331/1 A; 327/156; 327/157; 327/159; 327/105; 327/107
[58] Field of Search .............. 328/14, 155; 331/1 A, 331/25, 19, 22, 4, 17, 18, 16, 12; 327/105, 107, 155, 162

[56] References Cited

U.S. PATENT DOCUMENTS

| | | | |
|---|---|---|---|
| 4,009,448 | 2/1977 | Hopwood et al. | 331/4 |
| 4,077,016 | 2/1978 | Sanders et al. | 331/4 |
| 4,206,425 | 6/1980 | Nossen | 332/19 |
| 4,246,546 | 1/1981 | McDonald | 331/4 |
| 4,360,788 | 11/1982 | Erps et al. | 331/1 A |
| 4,464,638 | 8/1984 | Crowley et al. | 331/1 A |
| 4,584,539 | 4/1986 | Stankey | 331/16 |
| 4,788,509 | 11/1988 | Bahl et al. | 330/54 |
| 4,839,603 | 6/1989 | Mower et al. | 328/14 |
| 4,882,549 | 11/1989 | Galani et al. | 331/14 |
| 5,019,790 | 5/1991 | Kapetanic | 331/16 |
| 5,146,186 | 9/1992 | Vella | 331/16 |
| 5,184,093 | 2/1993 | Itoh et al. | 331/25 |
| 5,243,302 | 9/1993 | Camp, Jr. et al. | 331/16 |
| 5,313,173 | 5/1994 | Lampe | 332/103 |
| 5,343,168 | 8/1994 | Guthrie | 331/16 |

Primary Examiner—Robert J. Pascal
Assistant Examiner—Arnold Kinkead
Attorney, Agent, or Firm—Terry J. Anderson; Karl J. Hoch, Jr.

[57] ABSTRACT

A frequency synthesizer has the configuration of a phase locked loop (PLL) having a voltage controlled oscillator (VCO) generating an output signal, a phase detector for outputting a control signal to the VCO, and circuitry coupled to an output port the VCO for offsetting the frequency of a sample of the output signal. The synthesizer includes a sampling mixer operative with a source of reference signal and interconnecting the offset circuitry with the phase detector. The sampling mixer mixes the offset sample with the reference signal to output a comb frequency spectrum of signals differing in frequency from each other by multiples of the reference frequency. A filter selects a signal outputted by the sampling mixer at one of the comb frequencies for application to the phase detector. The phase detector is operative with a source of input signal having an input signal frequency for phase locking with the signal selected by the filter. The PLL includes a stabilizing loop filter circuit preceding the VCO and having means for adjusting a value of the control signal to tune the frequency of the output signal. In the offset circuitry, inphase and quadrature portions of the output sample are mixed with either the reference frequency or a fraction thereof, as selected by a switch, and are summed to provide the offset frequency sample to the sampling mixer.

9 Claims, 2 Drawing Sheets

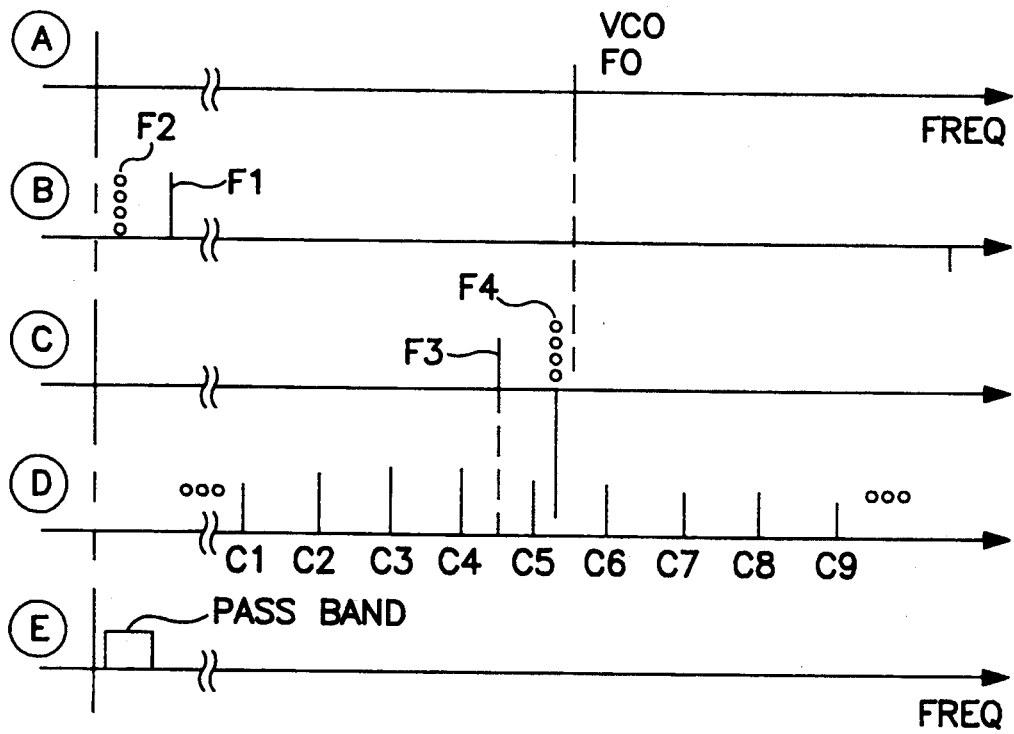
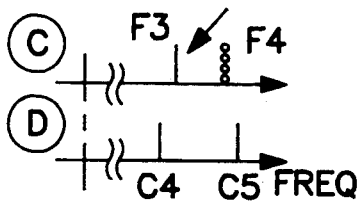 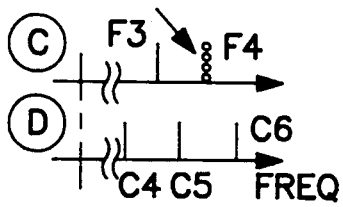 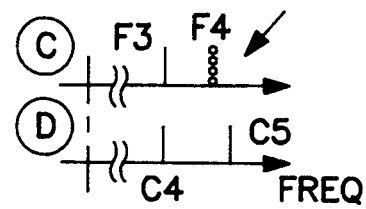
FIG. 3  FIG. 4  FIG. 5
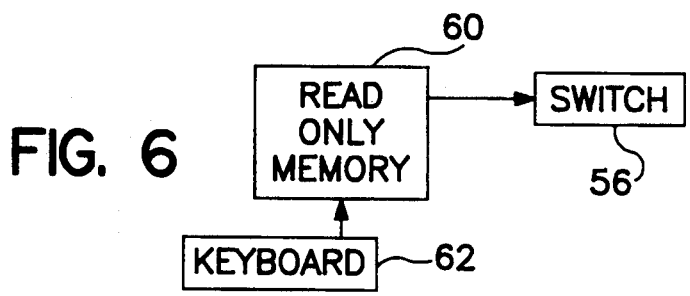
FIG. 6

FREQUENCY SYNTHESIZER WITH COMB SPECTRUM MIXER AND FRACTIONAL COMB FREQUENCY OFFSET

BACKGROUND OF THE INVENTION

This invention relates to a frequency synthesizer and, more particularly, to a synthesizer employing a phase locked loop having a mixer outputting a comb frequency spectrum for down conversion of an outputted frequency, and including circuitry for providing a fractional comb frequency offset of the outputted frequency to avoid aliasing of mixer output signals.

Synthesizers of high frequencies, in the gigahertz range by way of example, frequently employ a phase locked loop to stabilize the output signal frequency, and include also circuitry for down conversion in frequency of a sample of the output signal to enable use of lower frequency circuit components, such as those operating in the megahertz range, for phase locking the output signal to an input reference signal. Generally, it has been the practice to employ a frequency divider comprising one or more digital counters to accomplish the down conversion of frequency.

In the operation of the frequency divider, the counters divide both the frequency and the phase of the sample of the output signal. This operation is satisfactory for many applications, but suffers from a limitation in that there may be excessive phase noise in the output signal for applications requiring a precision output signal. For example, in the case of a divider which divides the frequency and the phase by a factor of ten for presentation to a phase detector of the phase locked loop, a phase deviation at the low frequency end of the divider is one tenth that at the high frequency end of the divider. Correspondingly, the phase noise power at the output signal is greater than the phase noise power at the input to the phase detector by a factor of 100 (20 decibels).

Thus, there is a problem in the use of a frequency divider in a phase locked loop in that there results a phase noise in the output signal which may be excessive for generation of precision frequency in the output signal. Conceptually, it is possible to provide the down conversion by mixing the sample of output signal with a reference signal which differs in frequency from the output signal by the desired value of intermediate frequency (IF) for operation of the phase detector. The mixing process avoids generation of the foregoing phase noise. The desired IF signal can be obtained by use of a mixer outputting a comb frequency spectrum wherein individual spectral lines are separated by harmonics of an input reference frequency. Such a mixer may be referred to as a sampling mixer in the frequency domain by analogy with the generation, in the time domain, of a series of sampling pulses by a pulse generator. However, heretofore, such mixers have not had general acceptance because the numerous output spectral lines introduce aliasing which inhibits extraction of the desired IF signal.

SUMMARY OF THE INVENTION

The aforementioned problems are overcome and other advantages are provided by a frequency synthesizer which, in accordance with the invention, has the configuration of a phase locked loop (PLL), and comprises a voltage controlled oscillator (VCO) generating an output signal, a phase detector for outputting a control signal to the VCO for establishing a frequency of the output signal, and further circuitry coupled to an output port of the VCO for providing an offset signal having a frequency offset from the frequency of the output signal. In addition, the synthesizer comprises a sampling mixer operative with a source of reference signal having a reference frequency, the sampling mixer interconnecting the offset circuitry with the phase detector. The sampling mixer mixes the offset signal with the reference signal to output a comb frequency spectrum of signals differing in frequency from each other by multiples of the reference frequency. A filter connects between the sampling mixer and the phase detector for selecting a signal outputted by the sampling mixer at one of the frequencies of the comb spectrum. The phase detector is operative with a source of input signal having an input signal frequency for phase locking with the signal selected by the filter. The offset circuitry provides a frequency offset equal to either an integral or non-integral multiple of the reference frequency.

The offset circuitry includes a switch for selecting either an integral or non-integral multiple of the reference frequency. The offset circuitry further comprises coupling means connected to the VCO for extracting inphase and quadrature samples of the output signal, and means for mixing the inphase and the quadrature samples with inphase and quadrature mixing signals having frequencies equal to either an integral or a non-integral multiple of the reference frequency as selected by the switch. This provides offset values of the inphase and the quadrature samples which are then summed to provide the offset signal. The mixing signals are provided by a frequency divider connected between the source of reference signal and the switch wherein the mixing signals equal, in a preferred embodiment of the invention, either the reference frequency or one quarter of the reference frequency. A loop filter is circuit coupled between the phase detector and the VCO for stabilizing the PLL. The loop filter circuit may include means for adjusting a value of the control signal to tune the frequency of the output signal.

BRIEF DESCRIPTION OF THE DRAWINGS

The aforementioned aspects and other features of the invention are explained in the following description, taken in connection with the accompanying drawing wherein:

FIG. 2 is a set of graphs of spectral lines useful in explaining operation of the invention;

FIGS. 3-5 show a portion of the set of graphs of FIG. 2 for three different values of an output frequency of the synthesizer of FIG. 1; and FIG. 6 shows additional circuitry which may be employed for automatic operation of a switch in the synthesizer of FIG. 1.

DETAILED DESCRIPTION

Figure 1:
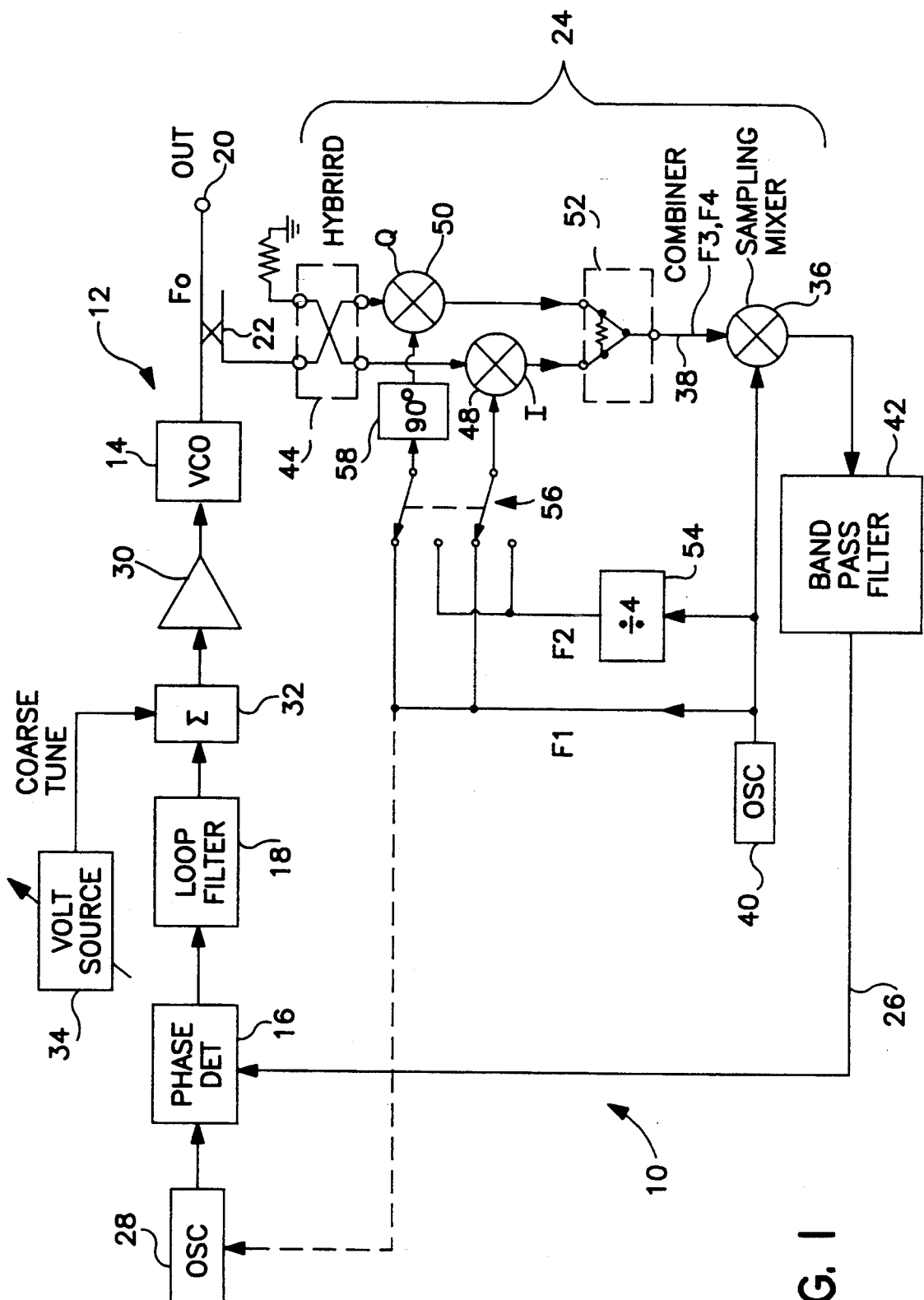
FIG. 1 is a block diagram of a frequency synthesizer constructed in accordance with the invention.

FIG. 1 shows a frequency synthesizer 10 constructed in the configuration of a phase-locked loop (PLL) 12 comprising a voltage controlled oscillator (VCO) 14, a phase detector 16 and a loop filter 18. The VCO 14 provides an output signal of the synthesizer 10 at an output port 20, the output signal having a frequency, by way of example, in the range of 12-20 gigahertz (GHz)

in a preferred embodiment of the invention. A sample of the output signal is extracted via a microwave directional coupler 22 to be processed by microwave circuitry 24 for providing a feedback signal on line 26 to an input terminal of the phase detector 16. A stable oscillator 28 provides an input signal to a second input terminal of the phase detector 16, the oscillator 28 being constructed in the form of a direct digital synthesizer in the preferred embodiment of the invention. The phase detector 16 operates at a signal frequency substantially lower than the output frequency of the VCO 14, for example, by approximately two orders of magnitude in the preferred embodiment of the invention wherein the signal outputted by the oscillator 28 is in a range of, typically, 150–450 megahertz (MHz).

In the operation of the PLL 12, the phase detector 16 outputs a loop error signal equal to the difference in phase between the feedback signal on line 26 and the input signal provided by the oscillator 28. The error signal is applied by the detector 16 via the loop filter 18 and an amplifier 30 to provide a control signal for the VCO 14. The voltage of the control signal establishes the value of the frequency outputted by the VCO 12. The loop filter 18 connects with an input terminal of the amplifier 30 via a summer 32 which enables a voltage from a variable voltage source 34 to be combined with the output signal of the filter 18 to produce a sum signal which is applied to the amplifier 30. The voltage source 34 provides for an adjustment of the control signal to the VCO 14 so as to provide for a coarse tuning of the VCO 14 to output a desired frequency at the output port 20. The loop filter 18 is constructed in accordance with well-known practice in the design of phase-locked loops, and may include, by way of example, lead-lag filter components.

In accordance with the invention, the microwave circuitry 24 enables the output frequency of the synthesizer 10 to be reduced by the aforementioned two orders of magnitude for operation of the phase detector 16. This is accomplished with the aid of a sampling mixer 36 which receives the output sample, offset in frequency in a manner to be described, on line 38 and mixes the sample on line 38 with a reference signal from an oscillator 40. The sampling mixer 36 outputs a comb spectrum of signals of which a single signal at a desired spectral line is selected by a band-pass filter 42 to be applied via line 26 to the phase detector 16. The operation of the sampling mixer 36 may be viewed as a multiplication of the sample signal on line 38 with a set of signals of an input comb spectrum separated in frequency by integral multiples of the frequency of the oscillator 40.

In accordance with a feature of the invention, the microwave circuitry 24 is operative to ensure that an outputted product of the sampling mixer 36 does not suffer from aliasing due to close proximity of the VCO output frequency with a spectral line of the input comb spectrum, nor from a location of the VCO output frequency equidistant from two of the input comb spectral lines, as will be described in further detail hereinafter. The microwave circuitry 24 further comprises a hybrid coupler 44 with one input port connected to the directional coupler 22 and a second input port grounded via a terminating resistor 46. The hybrid coupler 44 divides the input signal sample into two signals of equal power but differing in phase by 90 degrees (phase quadrature), the two phase quadrature signals being outputted via two output ports of the hybrid coupler 44 to two mixers 48 and 50 of which the mixer 48 operates with the in-phase (I) signal and the mixer 50 operates with the quadrature (Q) signal. The output signals of the mixers 48 and 50 are combined, without further introduction of relative phase shift, by the power combiner 52, such as a Wilkinson power combiner as shown in the figure, by way of example. The combined signal produced by the combiner 52 is applied via line 38 to the sampling mixer 36.

Reference signals for application to reference input ports of the mixers 48 and 50 are provided by means of the oscillator 40 with the aid of a frequency divider 54, a switch 56 and a ninety-degree phase shifter 58. With the switch 56 in the position shown in the figure, the output signal of the oscillator 40 is applied directly to the reference input port of the mixer 48, and is applied via the phase shifter 58 to the reference input port of the mixer 50. With the switch 56 in the alternate position, the signal outputted by the oscillator 40 is applied via a frequency divider 54 directly to the mixer 48 and via the phase shifter 58 to the mixer 50. In either position of the switch 56, the phase shifter 58 introduces a phase quadrature relationship between the reference input signals to the mixers 48 and 50. The divider 54 is operative to divide the frequency of the signal of the oscillator 40 by a factor of four. The microwave circuitry 24, including the hybrid coupler 44, the mixers 48 and 50, the power combiner 52, and the phase shifter 58 provide the function of a single sideband (SSB) image rejection mixer which, in a preferred embodiment of the invention, outputs only the lower sideband frequency of its mixing operation. The SSB mixer acts to offset the output signal of the VCO 14 by the frequency of the oscillator 40 or by one-quarter of the frequency of the oscillator 14, as will be described now in further detail.

In the operation of the microwave circuitry 24, the frequency of the oscillator 40 is less than that of the VCO frequency by approximately one order of magnitude. For example, in the preferred embodiment of the invention wherein the output frequency of the synthesizer 10 is in the range of 12–20 GHz, the frequency of the signal outputted by the oscillator is approximately 1.2 GHz. Thus, the microwave circuitry 24 is operative to offset the frequency of the output sample at the directional coupler 22 by approximately 10 percent in the situation, depicted in the figure, wherein the signal of the oscillator 40 is coupled by the switch 56 directly to the mixers 48 and 50. The offset in frequency of the sample signal is significantly smaller, approximately 1/40 of the VCO frequency, in the case of the alternate position of the switch 56 wherein the signal of the oscillator 40 is coupled via the frequency divider 54 to the mixers 48 and 50.

The choice of frequency offsets of one-tenth or one-fortieth of the VCO output frequency enables the mixing process with the sampling mixer 36 to be conducted in a fashion wherein a desired signal selected from the output comb spectrum of the sampling mixer 36 does not suffer from aliasing. The frequency division ratio of four at the divider 54 has been employed in the preferred embodiment of the invention; however, it is to be understood that the theory of the invention applies also to other frequency division ratios. However, the frequency division ratio of four is believed to be optimum or approximately optimum for shifting the frequency offset of the signal sample a sufficient amount relative to the input comb spectrum of the sampling mixer 36 to avoid an aliasing situation in the output comb spectrum of the mixer 36. The choice of the two mixing reference signals for the mixers 48 and 50, namely, either the frequency of the oscillator 40 or one-quarter of the frequency of the oscillator 40, enables the desired output signal of the sampling mixer 36 to fall within the passband of the filter 42. Thereby, the invention of the frequency synthesizer 10 accomplishes a major objective of allowing use of a sampling mixer 36 to reduce the output frequency of the synthesizer 10 by approximately two orders of magnitude while creating a relatively low-frequency feedback signal on line 26 which is free of aliasing.

The inventive feature of converting the output VCO frequency to a lower frequency for operation of the phase detector 16 by means of the sampling mixer 36 with prevention of aliasing is explained with reference to the frequency diagrams of FIGS. 2-5. In FIG. 2, there are five graphs of frequency spectra, the five graphs being identified by the letters A, B, C, D and E, and being presented in frequency registration with each other. FIGS. 3, 4 and 5 show enlarged views of the central portions of the graphs C and D for different values of frequency outputted by the VCO 14.

In FIG. 2, at graph A, the VCO output frequency is shown as F0. Graph B shows the output frequency of the oscillator 40 as F1 (a solid line), and the output frequency of the divider 54 as F2 (a dotted line). By virtue of the single sideband operation, a single frequency line F3 (shown as a solid line in Graph C) is outputted upon mixing F0 with F1 and, alternatively, a single frequency line F4 (shown as a dotted line in Graph C) is outputted upon mixing F0 with F2. The frequencies F0-F4 are identified also in FIG. 1.

At the sampling mixer 36, the single frequency F1 is converted essentially to a comb spectrum, some of which spectral lines are shown in Graph D as lines C1, C2, C3 - -. Mixing of the input frequency F3, F4 with lines of the comb spectrum produces a plurality of sum and difference frequencies. Of particular interest in the mixing process is the attainment of an output frequency falling within the passband (shown in Graph E) of the band pass filter 42. The passband of the filter 42 covers a spectral region of signals convenient for operation of the phase detector 16. Signal frequencies below the passband are so low in frequency that the signal frequencies are not rejected by the loop filter 18, the signal frequencies being sufficiently low to avoid appearance as spurious signals in the output of the synthesizer 10. One or two of the comb spectral lines have a frequency value for translating the frequency F3 or F4 to fall within the passband of the filter 42. By way of example, the comb lines C4 and C5 are presented in FIGS. 3, 4 and 5 to show the result of the mixing operation of the sampling mixer 36 to place an outputted signal of the mixer 36 within the passband of the filter 42.

In FIG. 2, the distance along the frequency scale between the frequencies F3 and C4 is approximately equal to the distance between the frequencies F4 and C5, this distance producing a difference frequency lying within the passband. By way of example, the switch 56 (FIG. 2) is positioned to select F1 for applying F3 to the mixer 36 so that the signal applied via line 26 to the phase detector 16 has a frequency equal to the difference between C4 and F3. The choice of F3 is indicated by an arrow in FIG. 3.

In the example of FIG. 4, the VCO frequency F0 is higher than in the case of FIG. 3 such that F3 falls approximately midway between C4 and C5. Use of the frequency F3 in the mixing process would create a problem in that the difference frequency F3-C4 is approximately the same as the difference frequency C5-F3. Also, the difference frequency is too high and falls outside of the passband of the filter 42. However, the frequency spacing between F3 and F4 is only ¾ of the spacing between the comb frequencies because of the division by four in the divider 54. Accordingly, F4 falls between C5 and C6. but is closer to C5 than to C6. Therefore, F4 is a suitable frequency for the mixing process, and the switch 56 is positioned to select F2 for obtaining F4. The choice of F4 is indicated by an arrow in FIG. 4.

In the example of FIG. 5, the VCO frequency F0 is lower than in the case of FIG. 3 such that F3 is approximately equal to C4. In this example, a mixing of F3 with C4 would produce an excessively low difference frequency and would be difficult to remove from the output of the synthesizer 10. Mixing of F3 with C5 or F4 with C4 would produce an excessively large difference frequency. However, the difference frequency of F4-C5 has a proper value for operation of the phase detector 16, and falls within the passband of the filter 42. The switch 56 is positioned for applying F2 to the mixers 48 and 50 for outputting F4 to the sampling mixer 36. The choice of F4 is indicated by an arrow in FIG. 5. The examples of FIGS. 3-5 show that an inappropriate choice of frequency F1, F2 results in an output frequency of the mixer 36 falling in a frequency band lying outside the passband of the filter 42. The required frequency F1, F2 is obtained by placing the switch 56 in the opposite position.

FIG. 6 shows, by way of example, additional circuitry for automatic operation of the switch 56. The additional circuitry includes a read-only memory 60 and an address entry device such as a keyboard 62 for enabling manual entry of an address to the memory 60 for designating a desired frequency of operation of the synthesizer 10. In response to the addressing of the memory 60, the memory 60 outputs a switch drive signal to place the switch 56 in either of its two positions to provide the requisite value of reference frequency for the SSB mixing operation.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A frequency synthesizer comprising:
    a voltage controlled oscillator (VCO) generating an output signal;
    a phase detector for outputting a control signal to the VCO for establishing a frequency of the output signal;
    offset means coupled to an output port of said VCO for providing an offset signal having a frequency offset from the frequency of said output signal, said offset means including
        a source of reference signal having a reference frequency, and
        a sampling mixer operative with said source of reference signal, said sampling mixer interconnecting said offset means with said phase detector, said sampling mixer mixing said offset signal with said reference signal to output a comb frequency spectrum of signals differing in frequency from each other by multiples of said reference frequency; and, a filter connected between said sampling mixer and said phase detector for selecting a signal outputted by said sampling mixer at one frequency of said comb spectrum;

wherein said phase detector is operative with a source of input signal having an input signal frequency for phase locking with the signal selected by said filter; and said offset means provides a frequency offset having either of a plurality of offset values, one of said offset values being smaller than the value of said reference frequency.

2. A frequency synthesizer according to claim 1 wherein said offset means includes switching means for selecting a value of said frequency offset.

3. A frequency synthesizer according to claim 2 wherein said offset means further comprises coupling means connected to said VCO for extracting inphase and quadrature samples of said output signal, means for mixing said inphase and said quadrature samples with respective inphase and quadrature mixing signals having frequencies equal to one of the values of said frequency offset as selected by said switching means, and means for summing said inphase and said quadrature samples to provide said offset signal.

4. A frequency synthesizer according to claim 3 wherein said source of reference signal is connected to a first contact set of said switching means to provide frequencies for said inphase and quadrature mixing signals equal to said reference frequency, and wherein further said offset means includes a frequency divider connected between said source of reference signal and a second contact set of said switching means to provide frequencies for said inphase and quadrature mixing signals equal to one quarter of said reference frequency.

5. A frequency, synthesizer according to claim 4 wherein said phase detector and said VCO are part of a phase locked loop (PLL), said synthesizer further comprising a loop filtering means coupled between said phase detector and said VCO for stabilizing said PLL.

6. A frequency synthesizer according to claim 5 wherein said loop filtering means includes means for adjusting a value of said control signal to tune the frequency of said output signal.

7. A frequency synthesizer according to claim 6, wherein:

said switching means further includes an output contact set having first and second output contacts;

said means for mixing said inphase and quadrature mixing signals comprises a quadrature mixer and an inphase mixer each connected between said coupling means and said means for summing;

said offset means further comprises a phase shifter connected between said first output contact of said switching means and said quadrature mixer; and said second output contact of said switching means is connected to said inphase mixer.

8. A frequency synthesizer according to claim 7, wherein said switching means connects said first contact set to said output contact set, whereby said frequencies of said inphase and quadrature mixing signals are selected as equal to said reference frequency.

9. A frequency synthesizer according to claim 7, wherein said switching means connects said second contact set to said output contact set, whereby said frequencies of said inphase and quadrature mixing signals are selected as equal to one quarter of said reference frequency.

* * * * *